(12) United States Patent
Song et al.

(10) Patent No.: US 12,308,088 B2
(45) Date of Patent: May 20, 2025

(54) SENSE AMPLIFIER INCLUDING PRE-AMPLIFYING CIRCUIT AND MEMORY DEVICE INCLUDING THE SAME

(71) Applicant: SAMSUNG ELECTRONICS CO., LTD., Suwon-si (KR)

(72) Inventors: Byungkyu Song, Suwon-si (KR); Seok Jin Cho, Suwon-si (KR); Dae Hyun Kim, Suwon-si (KR); Wonil Bae, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 364 days.

(21) Appl. No.: 17/660,232

(22) Filed: Apr. 22, 2022

(65) Prior Publication Data

US 2023/0078539 A1 Mar. 16, 2023

(30) Foreign Application Priority Data

Sep. 14, 2021 (KR) ........................ 10-2021-0122436

(51) Int. Cl.
| | |
|---|---|
| *G11C 7/06* | (2006.01) |
| *G11C 5/14* | (2006.01) |
| *G11C 7/10* | (2006.01) |
| *G11C 7/14* | (2006.01) |

(52) U.S. Cl.
CPC ............... *G11C 7/065* (2013.01); *G11C 5/14* (2013.01); *G11C 7/1039* (2013.01); *G11C 7/1048* (2013.01); *G11C 7/14* (2013.01)

(58) Field of Classification Search
CPC ..... G11C 7/065; G11C 7/1039; G11C 7/1048; G11C 7/14; G11C 5/14

USPC .................................................... 365/185.21
See application file for complete search history.

(56) References Cited

U.S. PATENT DOCUMENTS

| | | | | |
|---|---|---|---|---|
| 6,088,278 | A * | 7/2000 | Porter | G11C 7/065 |
| | | | | 365/208 |
| 6,104,655 | A * | 8/2000 | Tanoi | G11C 11/4091 |
| | | | | 365/207 |
| 6,496,429 | B2 | 12/2002 | Murai et al. | |
| 7,499,367 | B2 | 3/2009 | Park | |
| 7,936,615 | B2 | 5/2011 | Sunwoo et al. | |
| 7,990,793 | B2 | 8/2011 | Kajigaya | |
| 8,259,514 | B2 * | 9/2012 | Cho | G11C 7/062 |
| | | | | 365/189.11 |
| 8,300,484 | B2 | 10/2012 | Yoshida | |
| 9,406,354 | B1 | 8/2016 | Jung et al. | |
| 9,542,981 | B2 | 1/2017 | Arsovski et al. | |
| 9,806,703 | B2 | 10/2017 | Lin et al. | |
| 9,973,179 | B2 * | 5/2018 | Krishna | H03K 5/003 |
| 10,074,406 | B2 | 9/2018 | Hush | |

(Continued)

*Primary Examiner* — Connie C Yoha
(74) *Attorney, Agent, or Firm* — MORGAN, LEWIS & BOCKIUS LLP

(57) ABSTRACT

Disclosed is a sense amplifier which includes a pre-amplifier that is connected between an input node receiving an input signal and a first node, a second switch connected between the first node and a first output node outputting an output signal, an amplifier connected between the first output node and a second output node outputting an inverted output signal, and a second switch connected between the input node and the second output node. The pre-amplifier includes an inverter connected between the input node and the first node, and a third switch connected between the input node and the first node.

20 Claims, 15 Drawing Sheets

(56) References Cited

U.S. PATENT DOCUMENTS

| | | | |
|---|---|---|---|
| 10,319,425 B1* | 6/2019 | Jung | G11C 7/24 |
| 10,614,875 B2 | 4/2020 | Manning et al. | |
| 10,971,196 B1 | 4/2021 | Wang et al. | |
| 11,043,252 B2* | 6/2021 | Morita | G11C 29/14 |
| 2018/0268898 A1* | 9/2018 | Suzuki | G11C 13/0023 |
| 2020/0335148 A1* | 10/2020 | Morita | G11C 11/2273 |

* cited by examiner (COMPARATIVE EXAMPLE)

(COMPARATIVE EXAMPLE)

PRE-CHARGE PERIOD

PRE-AMPLIFYING PERIOD

AMPLIFYING PERIOD

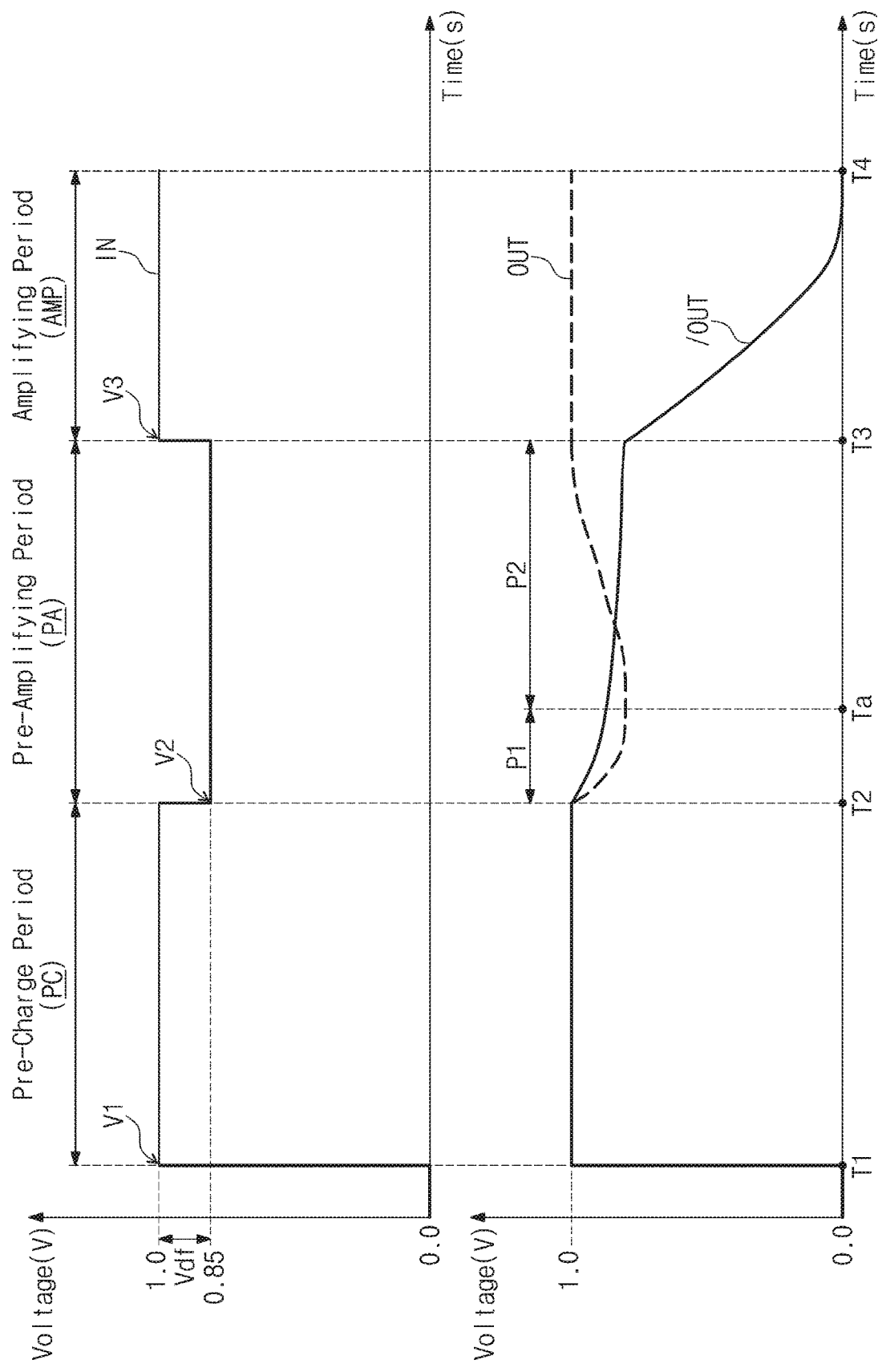

… (1)

SENSE AMPLIFIER INCLUDING PRE-AMPLIFYING CIRCUIT AND MEMORY DEVICE INCLUDING THE SAME

CROSS-REFERENCE TO RELATED APPLICATION

This application claims priority under 35 U.S.C. § 119 to Korean Patent Application No. 10-2021-0122436 filed on Sep. 14, 2021 in the Korean Intellectual Property Office, the disclosure of which is incorporated by reference herein in its entirety.

TECHNICAL FIELD

Embodiments of the present disclosure described herein relate to a sense amplifier and a memory device including the same.

DISCUSSION OF RELATED ART

A sense amplifier connected to a memory cell array through a global input/output (I/O) line of a dynamic random access memory (DRAM) memory device may receive an input signal through the global I/O line. A "single input sense amplifier" may read data of the memory cell by generating a reference voltage, sensing a difference between a voltage of the input signal and the reference voltage, and amplifying the sensed voltage difference.

When data stored in the memory cell corresponds to a logic low level, the voltage of the input signal may be a first input voltage level, and when the data stored in the memory cell corresponds to a logic high level, the voltage of the input signal may be a second input voltage level.

Herein, a differential voltage may refer to a result of subtracting the first input voltage from the second input voltage. In general, the higher the absolute value of the differential voltage, the higher the accuracy of identifying the data stored in the memory cell and the higher the operating speed. However, when differential voltage of the single input sense amplifier is high, power consumption may also be high. Accordingly, it would be desirable to provide a single input sense amplifier that accurately senses data of a memory cell and operates with low power consumption.

SUMMARY

Embodiments of the present disclosure provide a sense amplifier including a pre-amplifier and a memory device including the same.

According to an embodiment, a sense amplifier includes a pre-amplifier connected between an input node receiving an input signal and a first node, a second switch connected between the first node and a first output node that outputs an output signal, an amplifier connected between the first output node and a second output node that outputs an inverted output signal, and a first switch connected between the input node and the second output node. The pre-amplifier includes an inverter connected between the input node and the first node, and a third switch connected between the input node and the first node.

According to an embodiment, a sense amplifier includes a pre-amplifier connected between an input node receiving an input signal and a first node, a second switch connected between the first node and a first output node that outputs an output signal, an amplifier that is connected between the first output node and a second output node outputting an inverted output signal, and a second switch that is connected between the input node and the second output node. During a pre-charge period, the first switch and the second switch are controlled to be turned on, and the pre-amplifier generates a trip voltage. During a pre-amplifying period following the pre-charge period, the first switch and the second switch are controlled to be turned on, and the pre-amplifier generates a reference voltage and generates an amplification voltage based on a sum of the reference voltage and a differential voltage. During an amplifying period following the pre-amplifying period, the first switch and the second switch are controlled to be turned off, and the amplifier generates the output signal and the inverted output signal based on a voltage of the input signal and the amplification voltage.

According to an embodiment, a memory device includes a memory cell array that includes a plurality of memory cells connected to a plurality of bit lines, a global input/output line that is connected to the plurality of bit lines, and a sense amplifier that receives an input signal through the global input/output line and outputs an output signal and an inverted output signal. The sense amplifier includes a pre-amplifier connected between an input node receiving the input signal and a first node, a first switch connected between the first node and a first output node outputting the output signal, an amplifier connected between the first output node and a second output node outputting the inverted output signal, and a second switch connected between the input node and the second output node. The pre-amplifier includes a first capacitor connected between the first node and a second node, an inverter connected between the second node and a third node, a third switch connected between the second node and the third node, and a second capacitor connected between the third node and the first node.

BRIEF DESCRIPTION OF THE FIGURES

The above and other aspects and features of the present disclosure will become apparent by describing in detail embodiments thereof with reference to the accompanying drawings.

FIG. 11B is a graph illustrating a voltage waveform of an output signal according to an embodiment of the present disclosure.

DETAILED DESCRIPTION

Below, embodiments of the present disclosure will be described in detail and clearly to such an extent that one skilled in the art easily carries out the present disclosure. With regard to the description of the present disclosure, for simplicity of understanding, like components will be marked by like reference signs/numerals in drawings, and additional description may be omitted to avoid redundancy.

In the following description, when an element such as a voltage or circuit component is first introduced by a name and a label, the element may subsequently be referred to by just the label or an abbreviated name followed by the legend. For instance, a "first voltage V1" may later be referred to as just "V1" or a "third switch SW3" may later be called "switch SW3" or "SW3".

Herein, when a circuit element is said to be "connected between" two other circuit elements such as between a pair of components (e.g., nodes or other circuit elements), the circuit element may be directly connected between the pair of components or indirectly connected between the pair of components. In the directly connected case, no intervening component is present between the pair of components, and in the indirectly connected case, at least one intervening component is present between the pair of components.

Figure 1:
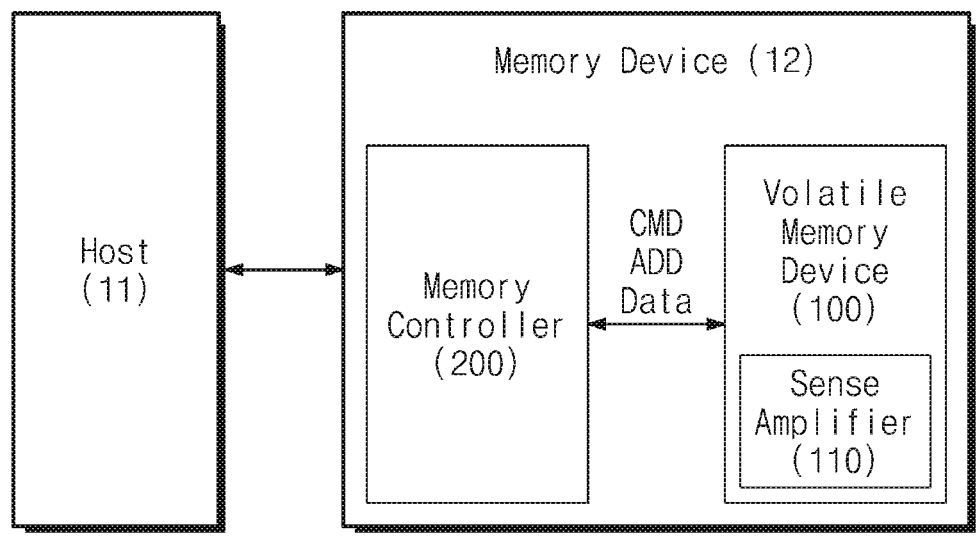
FIG. 1 is a block diagram of a storage system according to an embodiment of the present disclosure.

FIG. 1 is a block diagram illustrating a storage system 10 according to an embodiment of the present disclosure. The storage system 10 may include a host 11 and a memory device 12. The host 11 may control an overall operation of the memory device 12. For example, the host 11 may store data in the memory device 12 or may read data stored in the memory device 12.

The memory device 12 may include a volatile memory device 100 and a memory controller 200. The memory device 12 may store data in the volatile memory device 100 or may read data stored in the volatile memory device 100.

For example, the memory controller 200 may send a command CMD and an address ADD to the volatile memory device 100 to store the data in the volatile memory device 100 or to read data stored in the volatile memory device 100.

The volatile memory device 100 may receive the command CMD and the address ADD from the memory controller 200. In response to the received signals, the volatile memory device 100 may store data from the memory controller 200 or may provide data stored therein to the memory controller 200.

The volatile memory device 100 may include a sense amplifier 110. The sense amplifier 110 may perform a sensing operation based on a voltage representing data. In an embodiment, the volatile memory device 100 may be implemented as a dynamic random access memory (DRAM). A memory cell array included in the volatile memory device 100 may be connected to the sense amplifier 110 through a global input/output (I/O) line. The sense amplifier 110 may sense a difference between voltages of a signal received through the global I/O line at different times, using a reference voltage Vrf generated by a pre-amplifier, and may amplify the sensed voltage difference. Accordingly, the volatile memory device 100 may read data stored in a selected memory cell. The reference voltage Vrf may refer to a voltage for determining whether data of a memory cell represents a logic low or a logic high.

Figure 2:
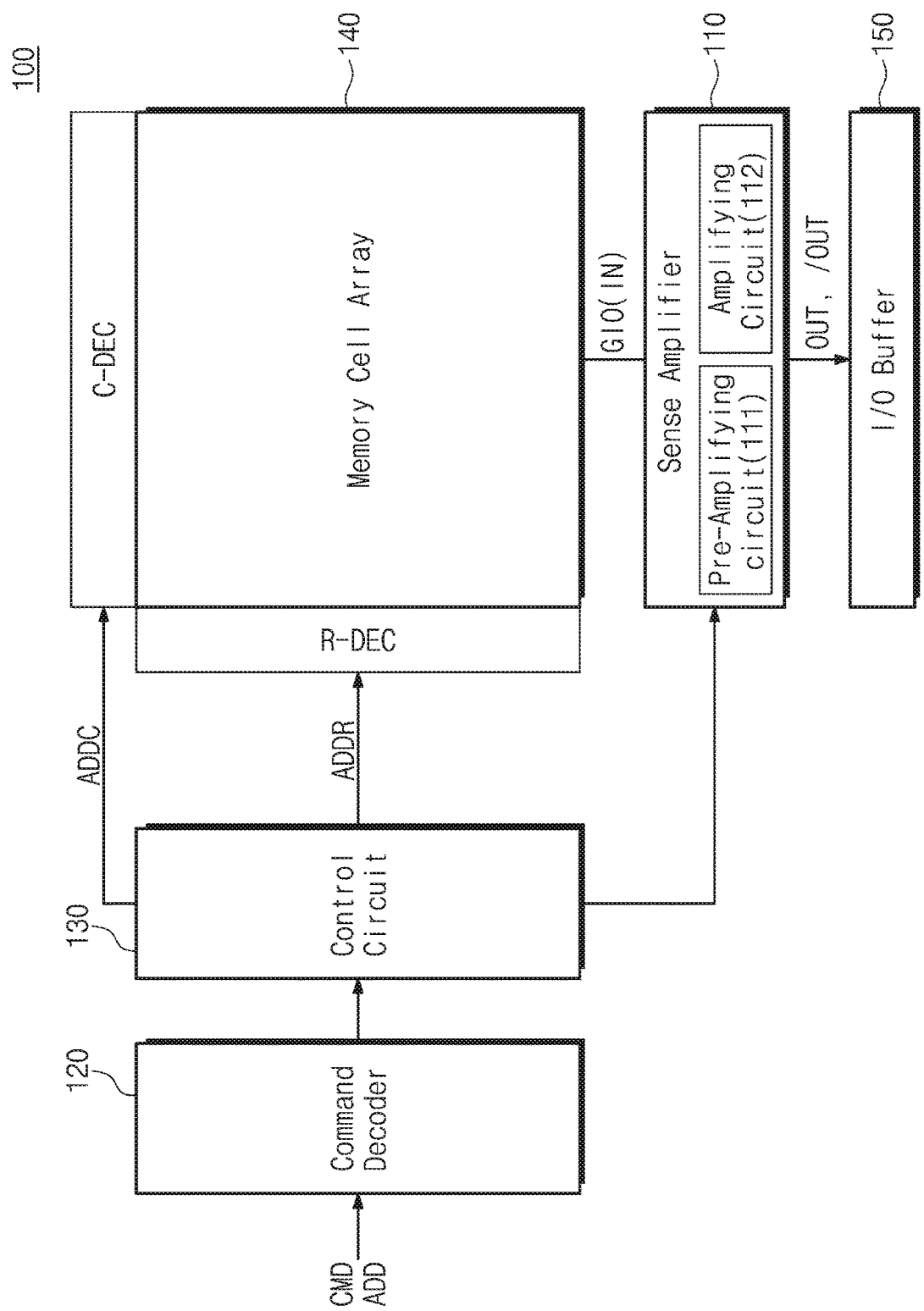
FIG. 2 is a block diagram illustrating a memory device of FIG. 1 in detail, according to some embodiments of the present disclosure.

FIG. 2 illustrates a block diagram of a memory device according to an embodiment of the present disclosure. Referring to FIG. 2, the volatile memory device 100 of FIG. 1 may include the sense amplifier 110, a command decoder 120, a control circuit 130, a memory cell array 140, and an input/output buffer 150.

The sense amplifier 110 may receive an input signal IN from the memory cell array 140 through a global I/O line GIO. The input signal IN may be a time varying voltage signal with a level that transitions from a first voltage V1 (shown in FIG. 10A) in a pre-charge period prior to data read-out, to a second voltage V2 (shown in FIG. 10B). When a datum read from a memory cell represents a first logic level, V1 and V2 may be about the same, differing by less than the reference voltage Vrf (shown in FIG. 10B). When the datum represents an opposite logic level, V1 and V2 may differ by more than the reference voltage Vrf. The sense amplifier 110 may sense a difference voltage Vdf (shown in FIGS. 10B and 11B) between V1 and V2, and correspondingly output a pair of opposite logic levels. A logic high is provided at one output terminal OUT and a logic low is provided at the other output terminal /OUT, or vice versa, depending on whether Vdf is below Vrf. The logic high voltage may be significantly greater than the highest level of Vdf. For example, Vdf may have an absolute value of about 0.15V when it exceeds Vrf, whereas the logic high output of the sense amplifier 110 may be about 1.0 volts. Thus, the sense amplifier 110 may be said to amplify the input signal IN (by providing a higher voltage than that of the signal IN at one of its output terminals).

The global I/O line GIO may be connected to a plurality of bit lines of the memory cell array 140. For example, in the case where the memory cell array 140 includes 1024 bit lines, the global I/O line GIO may be connected to the 1024 bit lines. For example, in the case where the memory cell array 140 includes 1024 bit lines, the global I/O line GIO may be connected to 8 bit lines. In an embodiment, each of the plurality of bit lines may include a pair of bit line and complementary bit line.

The sense amplifier 110 may compare a voltage of the input signal IN at different times, using the reference voltage, to read data of a memory cell connected to the sense amplifier 110. The sense amplifier 110 may generate an output signal OUT and an inverted output signal /OUT based on the voltage of the input signal IN and the reference voltage. The sense amplifier 110 may output the output signal OUT and the inverted output signal /OUT to the I/O buffer 150.

The sense amplifier 110 may include a pre-amplifying circuit (interchangeably, "pre-amplifier") 111 and an amplifying circuit (interchangeably, "amplifier") 112. The pre-amplifier 111 may generate the reference voltage and an amplification voltage Vamp. The amplification voltage Vamp may be a voltage obtained by amplifying an input voltage equaling a sum of the reference voltage Vrf and a difference voltage Vdf. The amplifying circuit 112 may generate the output signal OUT and the inverted output signal /OUT based on the input signal IN and the amplification voltage. Operations of the pre-amplifier 111 and the amplifying circuit 112 will be described in detail with reference to FIGS. 6 and 7.

The command decoder 120 may receive the command CMD and the address ADD from the memory controller 200. The command decoder 120 may decode the received command CMD and the received address ADD. The command CMD may refer to a signal directing an operation to be performed by the volatile memory device 100, such as a read operation or a write operation. The address ADD may include a row address ADDR and a column address ADDC.

The control circuit 130 may control a row decoder R-DEC, a column decoder C-DEC, and the sense amplifier 110, based on a decoding result of the command decoder 120. For example, the control circuit 130 may output the row address ADDR and the column address ADDC to the row decoder R-DEC and the column decoder C-DEC, respectively. Also, the control circuit 130 may control an operation of the sense amplifier 110, based on the decoding result.

The memory cell array 140 may include a plurality of memory cells. For example, the memory cells included in the memory cell array 140 may be respectively disposed at intersections of a plurality of word lines and the plurality of bit lines. Each of the memory cells may be connected to the corresponding word line of the plurality of word lines. Each of the memory cells may be connected to the corresponding bit line of the plurality of bit lines. The memory cells may be provided in a matrix form. In this case, the plurality of word lines may be connected to rows of memory cells, and the plurality of bit lines may be connected to columns of memory cells. Also, the plurality of bit lines may be connected to a global I/O line. In an embodiment, in the read operation, data of a memory cell included in the memory cell array 140 may be output to the global I/O line GIO through a bit line.

The row decoder R-DEC may receive the row address ADDR and a clock from the control circuit 130. The row decoder R-DEC may be connected to the memory cell array 140 through the plurality of word lines. The row decoder R-DEC may decode the received row address ADDR to select one of the plurality of word lines connected to the memory cell array 140. The row decoder R-DEC may activate the selected word line by applying a voltage to the selected word line.

The column decoder C-DEC may receive the column decoder C-DEC from the control circuit 130. The column decoder C-DEC may be connected to a precharge circuit and the sense amplifier 110 through the plurality of bit lines. The column decoder C-DEC may decode the received column address ADDC to select a bit line and a complementary bit line corresponding to a read unit from among the plurality of bit lines connected to the memory cell array 140. The column decoder C-DEC may activate the selected bit line by applying a voltage to the selected bit line.

The I/O buffer 150 may receive the output signal OUT and the inverted output signal /OUT from the sense amplifier 110. The I/O buffer 150 may temporarily store the output signal OUT and the inverted output signal /OUT. The data temporarily stored in the I/O buffer 150 may be output to an external device in response to a request of the external device.

Figure 3:
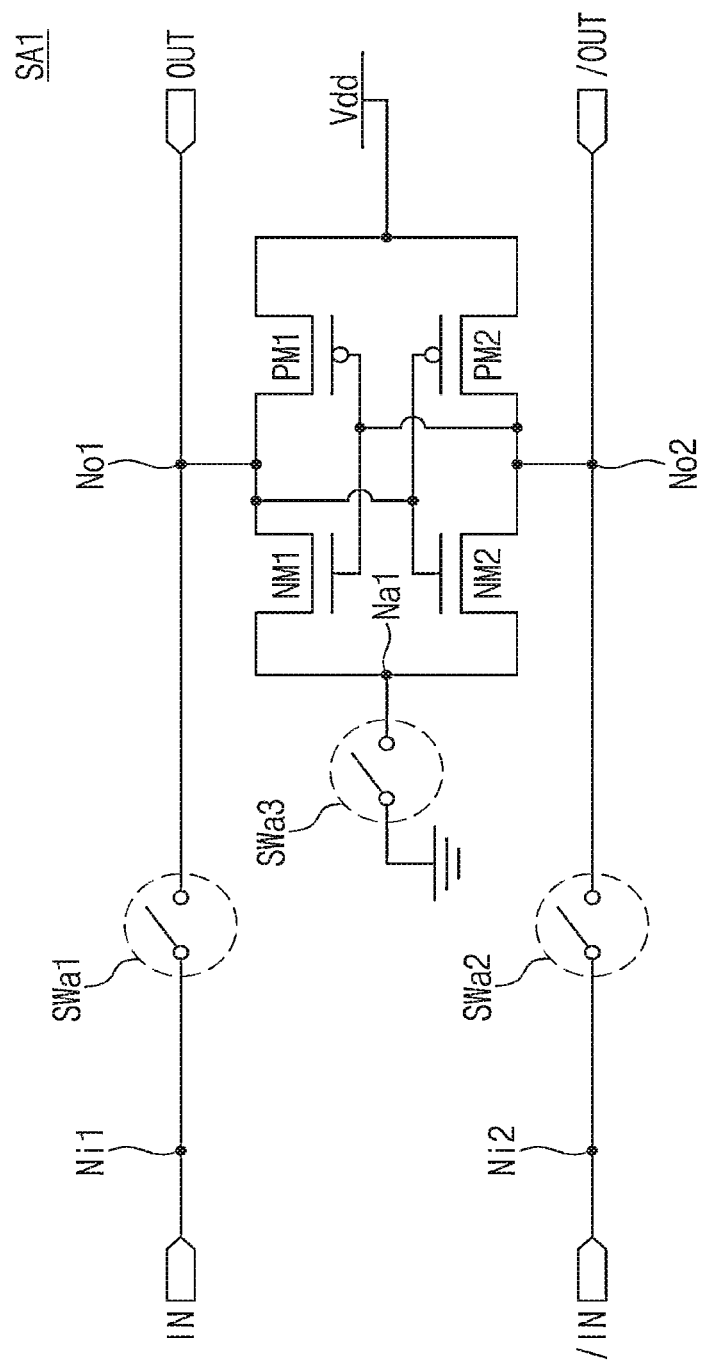
FIG. 3 is a circuit diagram illustrating a conventional sense amplifier.

FIG. 3 is a circuit diagram illustrating a conventional sense amplifier, SA1, which is a comparative example relative to embodiments of the present disclosure. Sense amplifier SA1 is a "pair input sense amplifier" that operates based on signals received from a global I/O line pair.

The sense amplifier SA1 receives an input signal IN and an inverted input signal /IN from the global I/O line pair may include a first switch SWa1 that is connected between a first input node Ni1 receiving the input signal IN and a first output node No1 outputting the output signal OUT, a second switch SWa2 that is connected between a second input node Ni2 receiving the inverted input signal /IN and a second output node No2 outputting the inverted output signal /OUT, a first PMOS transistor PM1 that is connected between a power node receiving a power supply voltage and the first output node No1 and operates based on the inverted output signal /OUT, a first NMOS transistor NM1 that is connected between the first output node No1 and a first node Na1 and operates based on the inverted output signal /OUT, a second PMOS transistor PM2 that is connected between the power node and the second output node No2 and operates based on the output signal OUT, a second NMOS transistor NM2 that is connected between the second output node No2 and the first node Na1 and operates based on the output signal OUT, and a third switch SWa3 that is connected between the first node Na1 and a ground node.

In the pair input sense amplifier SA1, the input signal IN and the inverted input signal /IN may be mutually used as a reference to sense data stored in a memory cell. For example, when a voltage of the input signal IN is greater than a voltage of the inverted input signal /IN, the data stored in the memory cell may correspond to a signal of the logic low. When the voltage of the input signal IN is smaller than the voltage of the inverted input signal /IN, the data stored in the memory cell may correspond to a signal of the logic high. As such, the pair input sense amplifier SA1 may identify data stored in a memory cell even when a voltage difference of the input signal IN and the inverted input signal /IN is small.

However, the pair input sense amplifier SA1 may require both the input signal IN and the inverted input signal /IN in all the read operations, thereby causing an increase in power consumption.

Figure 4:
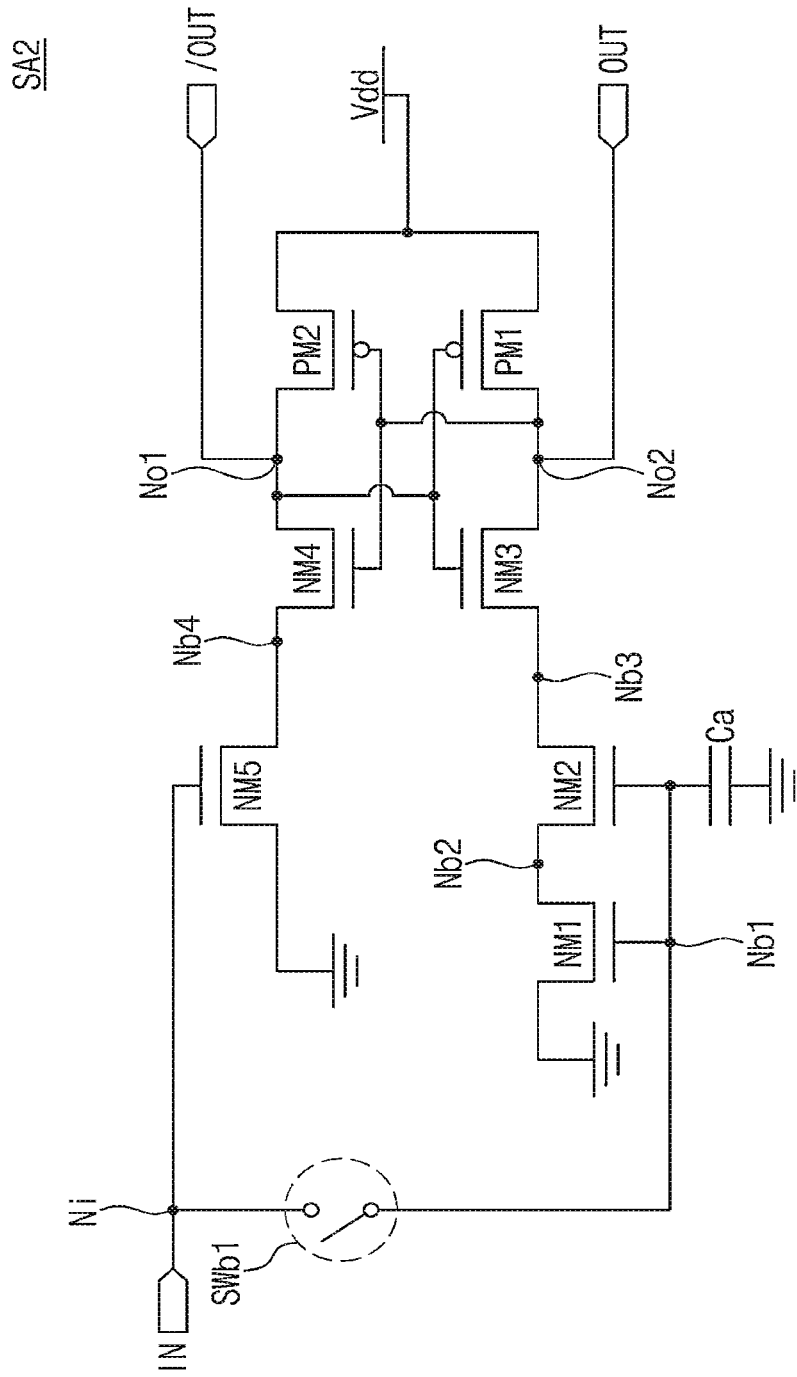
FIG. 4 is a circuit diagram illustrating a conventional sense amplifier.

FIG. 4 is a circuit diagram illustrating a conventional sense amplifier, SA2, which is also a comparative example relative to embodiments of the present disclosure. The sense amplifier SA2 is a single input sense amplifier that operates based on a signal received from a global I/O line. The sense amplifier SA2 may receive the input signal IN from the global I/O line, may sense a difference between a voltage of the input signal IN and a reference voltage, and may amplify the voltage difference. When data stored in a memory cell corresponds to the logic low, the voltage of the input signal IN may be the first input voltage, and when the data stored in the memory cell corresponds to the logic high, the voltage of the input signal IN may be the second input voltage. A differential voltage may correspond to a voltage that is obtained by subtracting the first input voltage from the second input voltage.

The single input sense amplifier SA2 may include a first switch SWb1 that is connected between an input node Ni and a first node Nb1, a first NMOS transistor NM1 that is connected between a second node Nb2 and a ground node and operates based on a signal of the first node Nb1, a second NMOS transistor NM2 that is connected between the second node Nb2 and a third node Nb3 and operates based on the signal of the first node Nb1, a capacitor Ca that is connected between the first node Nb1 and the ground node, a third NMOS transistor NM3 that is connected between the third node Nb3 and a second output node No2 outputting the output signal OUT and operates based on the inverted output signal /OUT, a first PMOS transistor PM1 that is connected between a power node and the second output node No2 and operates based on the inverted output signal /OUT, a second PMOS transistor PM2 that is connected between the power node and a first output node No1 outputting the inverted output signal /OUT and operates based on the output signal OUT, a fourth NMOS transistor NM4 that is connected between the first output node No1 and a fourth node Nb4 and operates based on the output signal OUT, and a fifth NMOS transistor NM5 that is connected between the fourth node Nb4 and the ground node and operates based on the input signal IN. The single input sense amplifier SA2 may generate the reference voltage based on the first NMOS transistor NM1 and the second NMOS transistor NM2.

Compared to the pair input sense amplifier SA1 of FIG. 3 that requires both the input signal IN and the inverted input signal /IN in all the read operations, the single input sense amplifier SA2 may receive only the input signal IN, and thus, power consumption of the single input sense amplifier SA2 may be smaller than that of the pair input sense amplifier SA1.

However, for the single input sense amplifier SA2 to accurately identify data stored in a memory cell, the first input voltage may be greater than the reference voltage, and the second input voltage may be smaller than the reference voltage. As an absolute value of the differential voltage becomes greater, the accuracy of identifying data stored in a memory cell may increase.

As such, the single input sense amplifier SA2 may require a differential voltage that is greater in value than a voltage difference of the input signal IN and the inverted input signal /IN of the pair input sense amplifier SA1. As the absolute value of the differential voltage becomes greater, the advantages that an operating speed of the single input sense amplifier SA2 increases and power consumption of the single input sense amplifier SA2 is smaller than that of the pair input sense amplifier SA1 may be canceled out.

Figure 5:
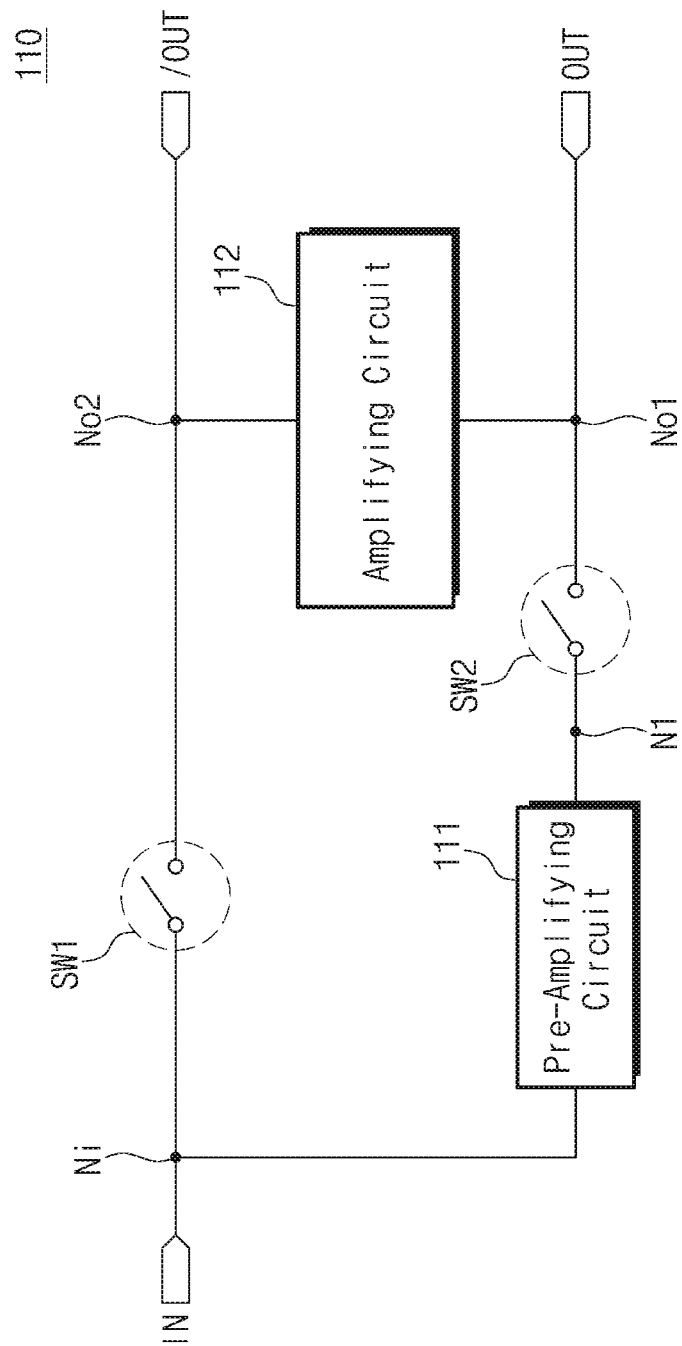
FIG. 5 is a block diagram illustrating a sense amplifier according to an embodiment of the present disclosure in detail.

FIG. 5 is a block diagram illustrating a sense amplifier according to an embodiment of the present disclosure in detail. Referring to FIG. 5, the sense amplifier 110 may include the pre-amplifier 111, the amplifying circuit 112, a first switch SW1, and a second switch SW2.

The sense amplifier 110 may receive the input signal IN from a global I/O line and may output the output signal OUT and the inverted output signal /OUT to an I/O buffer. The sense amplifier 110 may generate the output signal OUT and the inverted output signal /OUT based on the input signal IN and a reference signal. Because the sense amplifier 110 operates based on the input signal IN received from the global I/O line, power consumption of the sense amplifier 110 may be smaller than that of the pair input sense amplifier SA1 of FIG. 3 that operates based on signals received from a global I/O line pair.

The pre-amplifier 111 may be connected between an input node Ni receiving the input signal IN and a first node N1. The pre-amplifier 111 may generate a reference voltage. Also, the pre-amplifier 111 may amplify a sum of the reference voltage and a differential voltage to generate the amplification voltage.

As the pre-amplifier 111 amplifies a sum of the reference voltage and the differential voltage so as to be transferred to the amplifying circuit 112, a magnitude of the differential voltage that the sense amplifier 110 requires may be smaller than the differential voltage that the single input sense amplifier SA2 of FIG. 4 requires. As such, an operating speed of the sense amplifier 110 may be improved compared to the single input sense amplifier SA2, and power consumption of the sense amplifier 110 may be smaller than that of the single input sense amplifier SA2. The pre-amplifier 111 will be described in detail with reference to FIG. 6.

The amplifying circuit 112 may be connected between a first output node No1 outputting the output signal OUT and a second output node No2 outputting the inverted output signal /OUT. The amplifying circuit 112 may generate the output signal OUT and the inverted output signal /OUT based on the input signal IN and an amplification signal. The amplifying circuit 112 will be described in detail with reference to FIG. 7.

The first switch SW1 may be connected between the input node N1 and the second output node No2. The second switch SW2 may be connected between the first node N1 and the first output node No1. Operations of the first switch SW1 and the second switch SW2 may be controlled by a control circuit.

Figure 6:
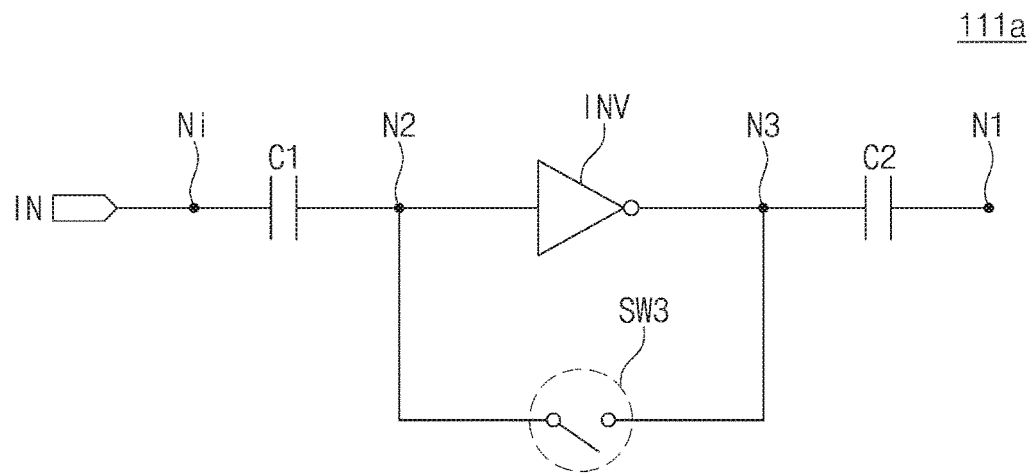
FIG. 6 is a circuit diagram illustrating a pre-amplifier of FIG. 5 according to an embodiment of the present disclosure in detail.

FIG. 6 is a circuit diagram illustrating a pre-amplifier of FIG. 5 according to an embodiment of the present disclosure. Referring to FIG. 6, a pre-amplifier 111a may include an inverter INV and a third switch SW3.

The inverter INV may be connected between the input node Ni and the first node N1. In an embodiment, an input terminal of the inverter INV may be connected to the input node Ni through a first capacitor C1, and an output terminal of the inverter INV may be connected to the first node N1 through a second capacitor C2. For example, in the case where the input terminal of the inverter INV is a second node N2 and the output terminal of the inverter INV is a third node N3, the first capacitor C1 may be connected between the input node Ni and the second node N2. The inverter INV may be connected to the second node N2 and the third node N3. The second capacitor C2 may be connected between the third node N3 and the first node N1.

The third switch SW3 may be connected between the input node Ni and the first node N1. In an embodiment, a first terminal of the third switch SW3 may be connected to the input node Ni through the first capacitor C1, and a second terminal of the third switch SW3 may be connected to the first node N1 through the second capacitor C2. For example, in the case where the first terminal of the third switch SW3 is the second node N2 and the second terminal of the third switch SW3 is the third node N3, the first capacitor C1 may be connected between the input node N1 and the second node N2. The third switch SW3 may be connected to the second node N2 and the third node N3. The second capacitor C2 may be connected between the third node N3 and the first node N1.

In an embodiment, the third switch SW3 may be implemented with a PMOS transistor. In an embodiment, the third switch SW3 may be implemented with an NMOS transistor. An operation of the third switch SW3 may be controlled by a control circuit.

When the third switch SW3 is turned on, the second and third nodes N2 and N3 placed on opposite sides of the inverter INV (hereinafter referred to as "opposite nodes N2 and N3 of the inverter INV") may be connected. In this case, the inverter INV may operate in a metastable state. Voltage levels of the second node N2 and the third node N3 may be the same. The voltage levels of the second node N2 and the third node N3 may correspond to a trip voltage level. The trip voltage may refer to a voltage when opposite nodes N2 and N3 of the inverter INV have the same voltage. For example, the trip voltage may be 0.5 times the power supply voltage. When each of the opposite nodes N2 and N3 of the inverter INV has the trip voltage, the inverter INV may operate ideally. That is, the trip voltage may correspond to a voltage for an amplification operation of the inverter INV.

When the third switch SW3 is turned off, the first capacitor C1 may accumulate an amount of charges corresponding to the reference voltage, by the charge injection of the third switch SW3. The charge injection may refer to a phenomenon in which channel charges of a transistor are injected into a source node and a drain node when a switch implemented with a transistor transitions from a turn-on state to a turn-off state.

For example, when the third switch SW3 is implemented with a PMOS transistor and the third switch SW3 transitions from a turn-on state to a turn-off state, the first capacitor C1 may accumulate charges being some of holes accumulated in the channel of the third switch SW3. As such, the voltage of the second node N2 may be increased as much as a reference voltage corresponding to an amount of charges, which are some of the holes accumulated in the channel of the third switch SW3. Also, when the third switch SW3 is turned off, the inverter INV may amplify the voltage of the second node N2 with a voltage gain, and the amplified voltage is output to the third node N3.

The first capacitor C1 and the second capacitor C2 may perform AC coupling. In the case where the first capacitor C1 receives both a direct current (DC) signal and an alternating current (AC) signal, the first capacitor C1 may remove the DC signal and may output only the AC signal. For example, the first capacitor C1 may not output the input signal IN to the second node N2. The second capacitor C2 may output only an amplification signal having an amplification voltage to the first node N1.

Figure 7:
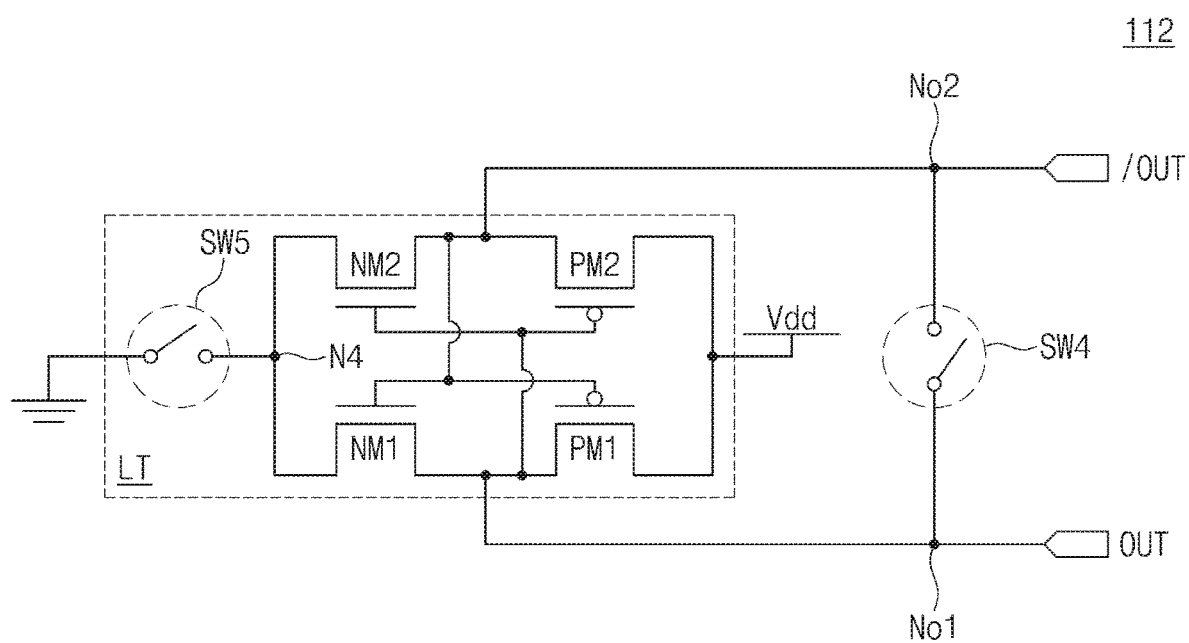
FIG. 7 is a circuit diagram illustrating an amplifier of FIG. 5 according to an embodiment of the present disclosure in detail.

FIG. 7 is a circuit diagram illustrating an amplifying circuit of FIG. 5 according to an embodiment of the present disclosure. Referring to FIG. 7, the amplifying circuit 112 may include a latch circuit LT and a fourth switch SW4.

The fourth switch SW4 may be connected between the first output node No1 and the second output node No2. When the fourth switch SW4 is turned on, the first output node No1 and the second output node No2 may have the same voltage. An operation of the fourth switch SW4 may be controlled by a control circuit.

The latch circuit LT may be connected between the first output node No1 and the second output node No2. The latch circuit LT may sense a voltage difference of the first output node No1 and the second output node No2 to amplify the sensed voltage difference. The latch circuit LT may generate the output signal OUT and the inverted output signal /OUT having the amplified voltage difference.

The latch circuit LT may include a first PMOS transistor PM1 that is connected between a power node receiving a power supply voltage and the first output node No1 and operates based on the inverted output signal /OUT, a first NMOS transistor NM1 that is connected between the first output node No1 and a fourth node N4 and operates based on the inverted output signal /OUT, a second PMOS transistor PM2 that is connected between the power node and the second output node No2 and operates based on the output signal OUT, and a second NMOS transistor NM2 that is connected between the second output node No2 and the fourth node N4 and operates based on the output signal OUT.

A fifth switch SW5 may be connected between the fourth node N4 and a ground node. When the fifth switch SW5 is turned on, the latch circuit LT may generate the output signal OUT and the inverted output signal /OUT based on a voltage difference of the first output node No1 and the second output node No2. An operation of the fifth switch SW5 may be controlled by a control circuit.

Figure 8:
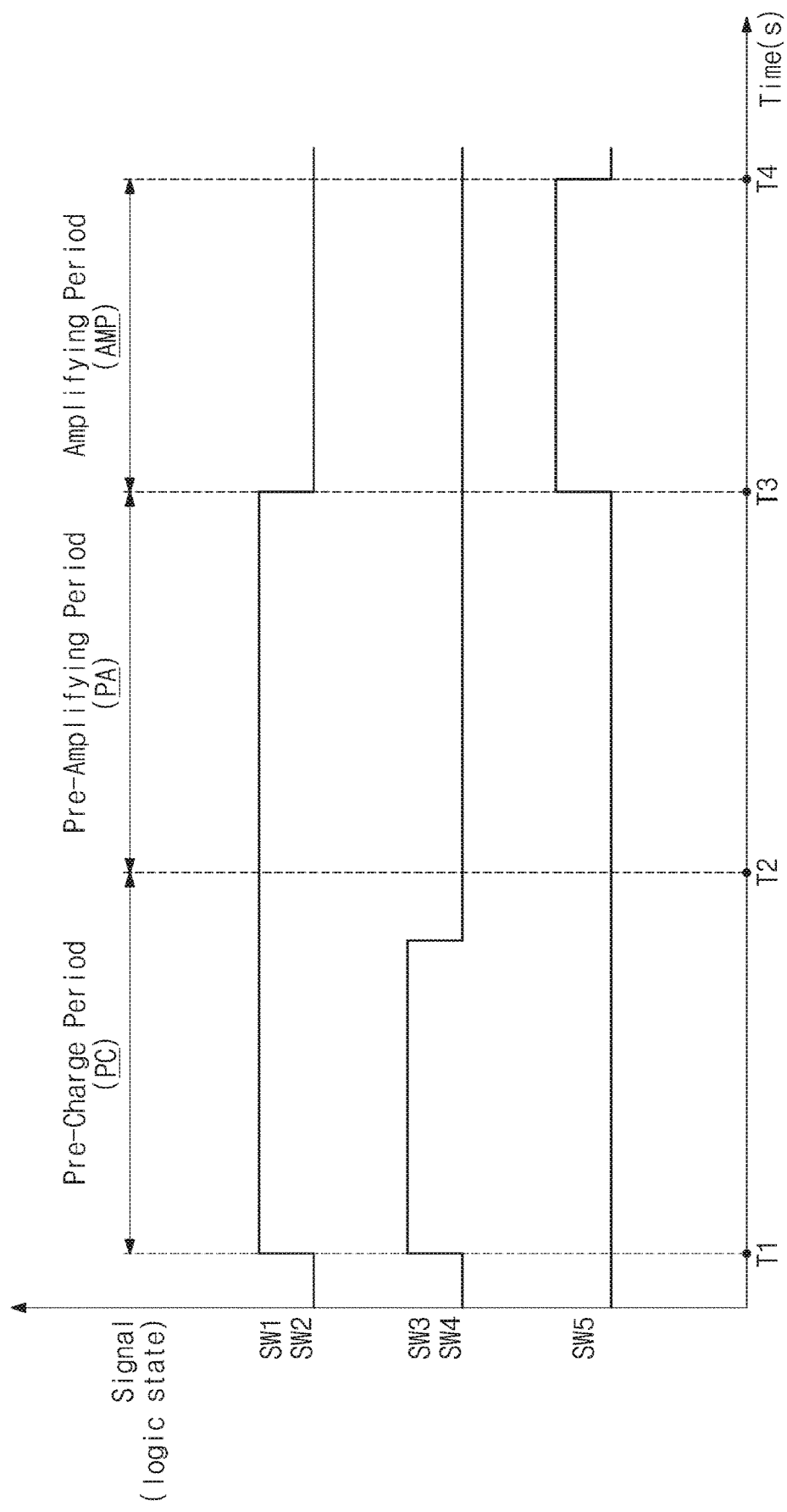
FIG. 8 illustrates graphs describing control signals of a sense amplifier according to an embodiment of the present disclosure.

FIG. 8 illustrates graphs describing control signals of a sense amplifier according to an embodiment of the present disclosure. Switch control signals of the switches SW1 to SW5 of the sense amplifier 110 of FIG. 5, the pre-amplifier 111a of FIG. 6, and the amplifying circuit 112 of FIG. 7 will be described with reference to FIG. 8. In FIG. 8, a horizontal axis represents a time, and a vertical axis represents information of a signal.

A pre-charge period PC may be a time period from a first time point T1 to a second time point T2. In the pre-charge period PC, the first to fourth switches SW1, SW2, SW3, and SW4 may be turned on. The fifth switch SW5 may be turned off. In the pre-charge period PC, the first output node No1 and the second output node No2 may receive the input signal IN, and voltage levels of the second node N2 and the third node N3 may correspond to the trip voltage. The pre-charge period PC will be described in detail with reference to FIG. 10A.

A pre-amplifying period PA may be a time period after the pre-charge period PC. For example, the pre-amplifying period PA may be a time period from the second time point T2 to a third time point T3. In the pre-amplifying period PA, the first and second switches SW1 and SW2 may be turned on. The third to fifth switches SW3, SW4, and SW5 may be turned off. In the pre-amplifying period PA, the second node N2 may be charged to a sum of the trip voltage, the reference voltage, and the differential voltage. The differential voltage may correspond to a voltage that is obtained by subtracting the voltage of the input signal IN in the pre-charge period PC from the voltage of the input signal IN in the pre-amplifying period PA.

The inverter INV may amplify the voltage of the second node N2 with a voltage gain and may generate an amplification signal having the amplification voltage. The voltage of the third node N3 may correspond to a sum of the trip voltage and the amplification voltage. The second capacitor C2 may output the amplification voltage to the first node N1. The pre-amplifying period PA will be described in detail with reference to FIG. 10B.

An amplifying period AMP may be a time period after the pre-amplifying period PA. For example, the amplifying period AMP may be a time period from the third time point T3 to a fourth time point T4. In the amplifying period AMP, the fifth switch SW5 may be turned on. The first to fourth switches SW1, SW2, SW3, and SW4 may be turned off. In the amplifying period AMP, the latch circuit LT may amplify a voltage difference of the first output node No1 and the second output node No2 at the third time point T3 to generate the output signal OUT and the inverted output signal /OUT. That is, a voltage difference of the first output node No1 and the second output node No2 at the fourth time point T4 may be greater than a voltage difference of the first output node No1 and the second output node No2 at the third time point T3.

Figure 9A:
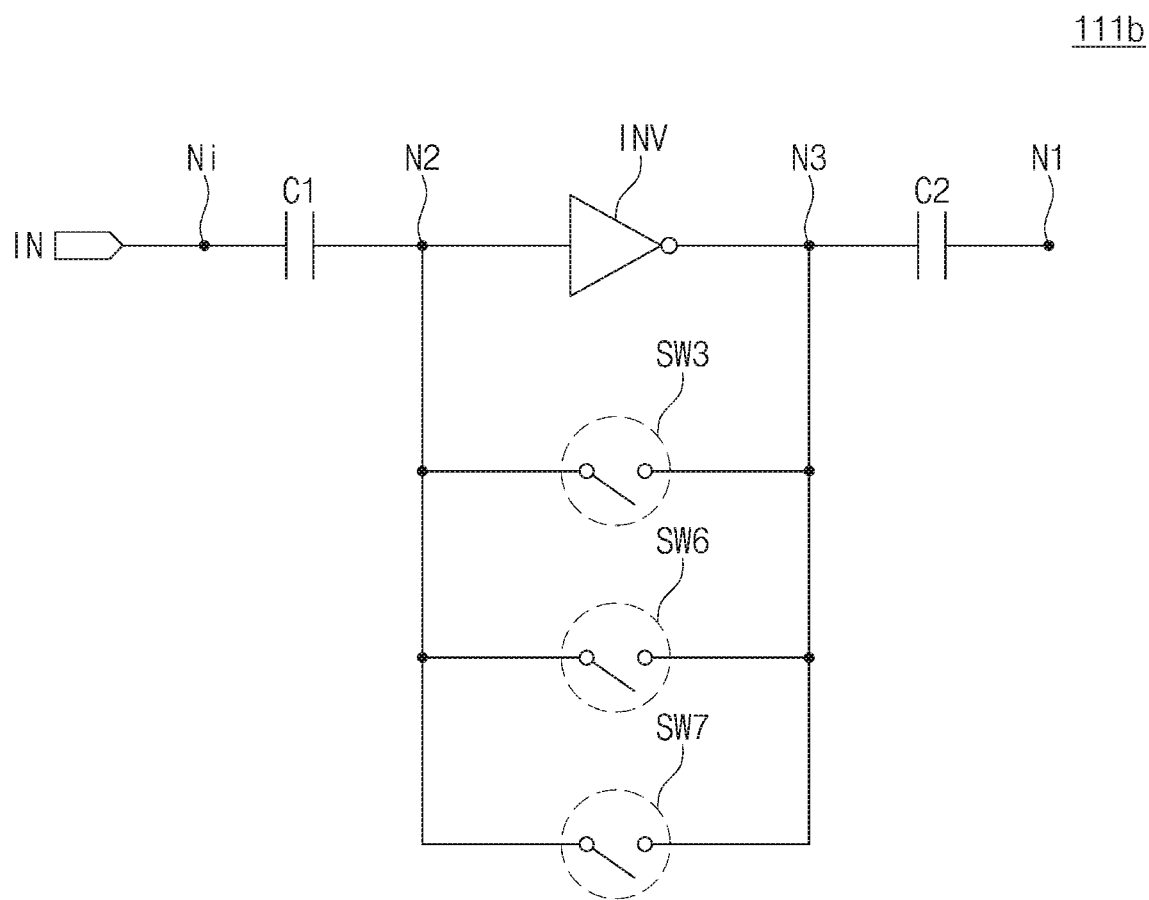
FIG. 9A is a circuit diagram illustrating a pre-amplifier of FIG. 5 according to an embodiment of the present disclosure in detail.

FIG. 9A is a circuit diagram illustrating a pre-amplifier circuit according to an embodiment of the present disclosure. Referring to FIG. 9A, a pre-amplifier 111b may include the first capacitor C1, the second capacitor C2, the inverter INV, the third switch SW3, a sixth switch SW6, and a seventh switch SW7. The pre-amplifier 111b may correspond to the pre-amplifier 111a of FIG. 6.

The third switch SW3 may be connected between the second node N2 and the third node N3. The sixth switch SW6 may be connected between the second node N2 and the N3. The seventh switch SW7 may be connected between the second node N2 and the third node N3.

During a pre-charge period, at least one of the third switch SW3, the sixth switch SW6, and the seventh switch SW7 may be controlled to be turned on (hereafter, just "turned on" or "turned off". During a pre-amplifying period, the third switch SW3, the sixth switch SW6, and the seventh switch SW7 may be turned off. For example, during the pre-charge period, the third switch SW3 and the sixth switch SW6 may be turned on, and the seventh switch SW7 may be turned off, during the pre-amplifying period, the third switch SW3, the sixth switch SW6, and the seventh switch SW7 may be turned off.

The number of switches turned on during the pre-charge period may be proportional to a magnitude of a reference voltage. For example, a reference voltage that is determined when the third switch SW3 and the sixth switch SW6 are turned on during the pre-charge period may be greater than a reference voltage that is determined when the third switch SW3 is turned on during the pre-charge period.

The pre-amplifier 111b includes three switches SW3, SW6, and SW7, but the present disclosure is not limited thereto. For example, the pre-amplifier 111b may further include switches connected between the second node N2 and the third node N3.

Figure 9B:
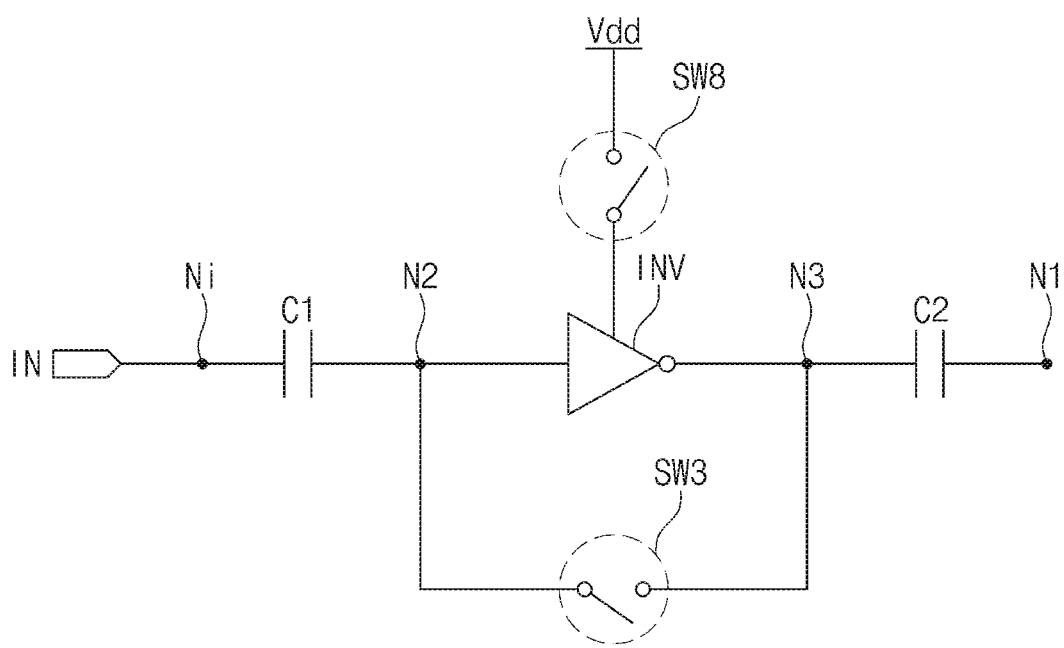
FIG. 9B is a circuit diagram illustrating a pre-amplifier of FIG. 5 according to an embodiment of the present disclosure in detail.

FIG. 9B is a circuit diagram illustrating a pre-amplifier circuit according to an embodiment of the present disclosure. Referring to FIG. 9B, a pre-amplifier 111c may include an eighth switch SW8 controlling the inverter INV. The pre-amplifier 111c may correspond to the pre-amplifier 111a of FIG. 6.

The eighth switch SW8 may be turned on during the pre-charge period and the pre-amplifying period, and may be turned off during the amplifying period. Because the eighth switch SW8 is turned off during the amplifying period, static power consumption may decrease. For example, because the eighth switch SW8 is turned off during the amplifying period, a leakage current of the sense amplifier 110 may decrease.

Figure 10A:
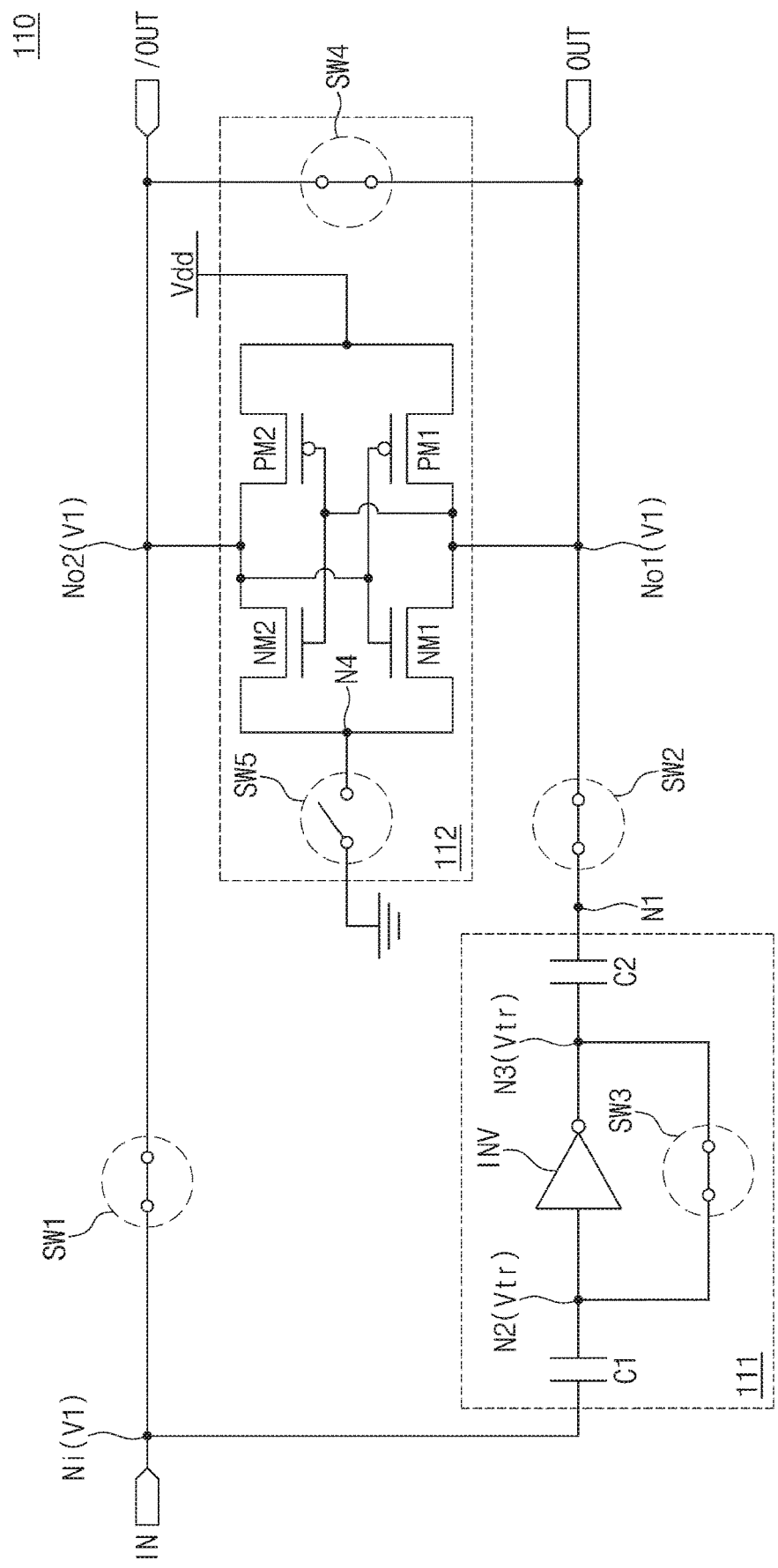
FIG. 10A is a circuit diagram describing an operation in a pre-charge period according to an embodiment of the present disclosure.

FIG. 10A is a circuit diagram describing an operation in a pre-charge period according to an embodiment of the present disclosure. Referring to FIGS. 8 and 10A, the first to fourth switches SW1, SW2, SW3, and SW4 may be turned on. The fifth switch SW5 may be turned off. During the pre-charge period PC, the input signal IN may have a first voltage V1 (the instantaneous voltage of the input signal IN equals V1).

Because the first switch SW1 and the fourth switch SW4 are turned on, the first output node No1 and the second output node No2 may receive the input signal IN. In this case, the first output node No1 and the second output node No2 may have the first voltage V1.

As the opposite nodes N2 and N3 of the inverter INV are connected due to the third switch SW3 being turned on, the second node N2 and the third node N3 may have the same voltage, which may be a trip voltage Vtr.

Figure 10B:
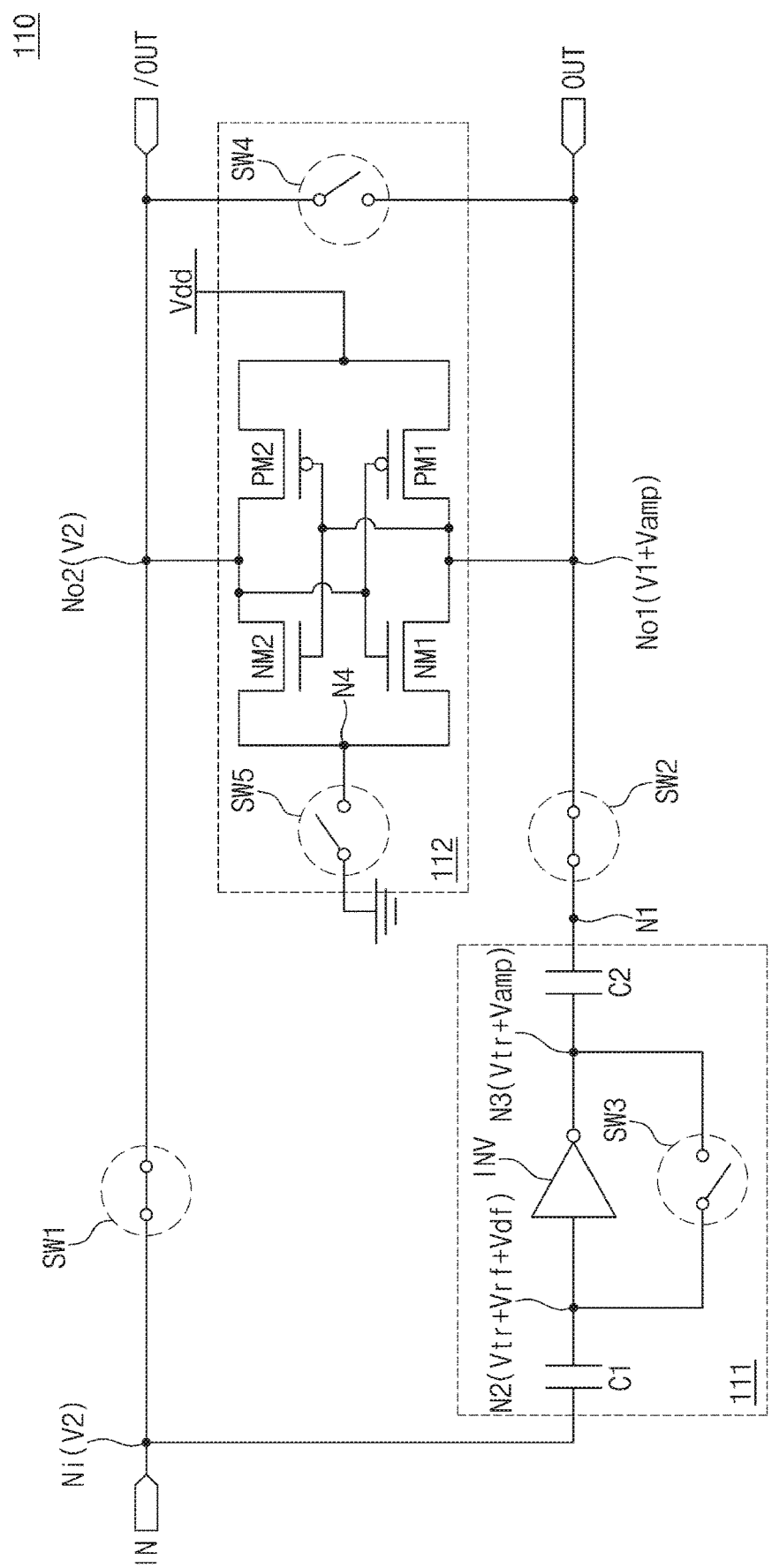
FIG. 10B is a circuit diagram describing an operation in a pre-amplifying period according to an embodiment of the present disclosure.

FIG. 10B is a circuit diagram describing an operation in a pre-amplifying period according to an embodiment of the present disclosure. Referring to FIGS. 8 and 10B, the first and second switches SW1 and SW2 may be turned on, and the third to fifth switches SW3, SW4, and SW5 may be turned off.

During the pre-amplifying period PA, the input signal IN may have a second voltage V2. A differential voltage Vdf may correspond to a voltage that is obtained by subtracting the first voltage V1 from the second voltage V2.

In an embodiment, when data stored in a memory cell connected to the sense amplifier 110 have the logic low, the first voltage V1 and the second voltage V2 may be the same. In an embodiment, when the data stored in the memory cell connected to the sense amplifier 110 has the logic high, the second voltage V2 may be smaller than the first voltage V1.

During the pre-amplifying period PA, the first capacitor C1 may further accumulate an amount of charges corresponding to the differential voltage Vdf. Also, the first capacitor C1 may further accumulate an amount of charges corresponding to a reference voltage Vrf, by the charge injection of the third switch SW3. As such, the voltage of the second node N2 may correspond to a sum of the trip voltage Vtr, the reference voltage Vrf, and the differential voltage Vdf.

The inverter INV may generate an amplification voltage Vamp based on a sum of the reference voltage Vrf and the differential voltage Vdf of the second node N2. As such, the voltage of the third node N3 may correspond to a sum of the trip voltage Vtr and the amplification voltage Vamp.

The trip voltage Vtr may be a voltage that allows the inverter INV to amplify the sum of the reference voltage Vrf and the differential voltage Vdf with a maximum voltage gain. As such, the inverter INV may generate the amplification voltage Vamp by amplifying the sum of the reference voltage Vrf and the differential voltage Vdf with the maximum voltage gain. As the pre-amplifier 111 amplifies the sum of the reference voltage Vrf and the differential voltage Vdf so as to be transferred to the amplifying circuit 112, even though a magnitude of the differential voltage Vdf is small, the sense amplifier 110 may accurately read data stored in a memory cell.

During the pre-amplifying period PA, the second output node No2 may have the second voltage V2. The voltage of the first output node No1 may correspond to a sum of the first voltage V1 and the amplification voltage Vamp.

Figure 10C:
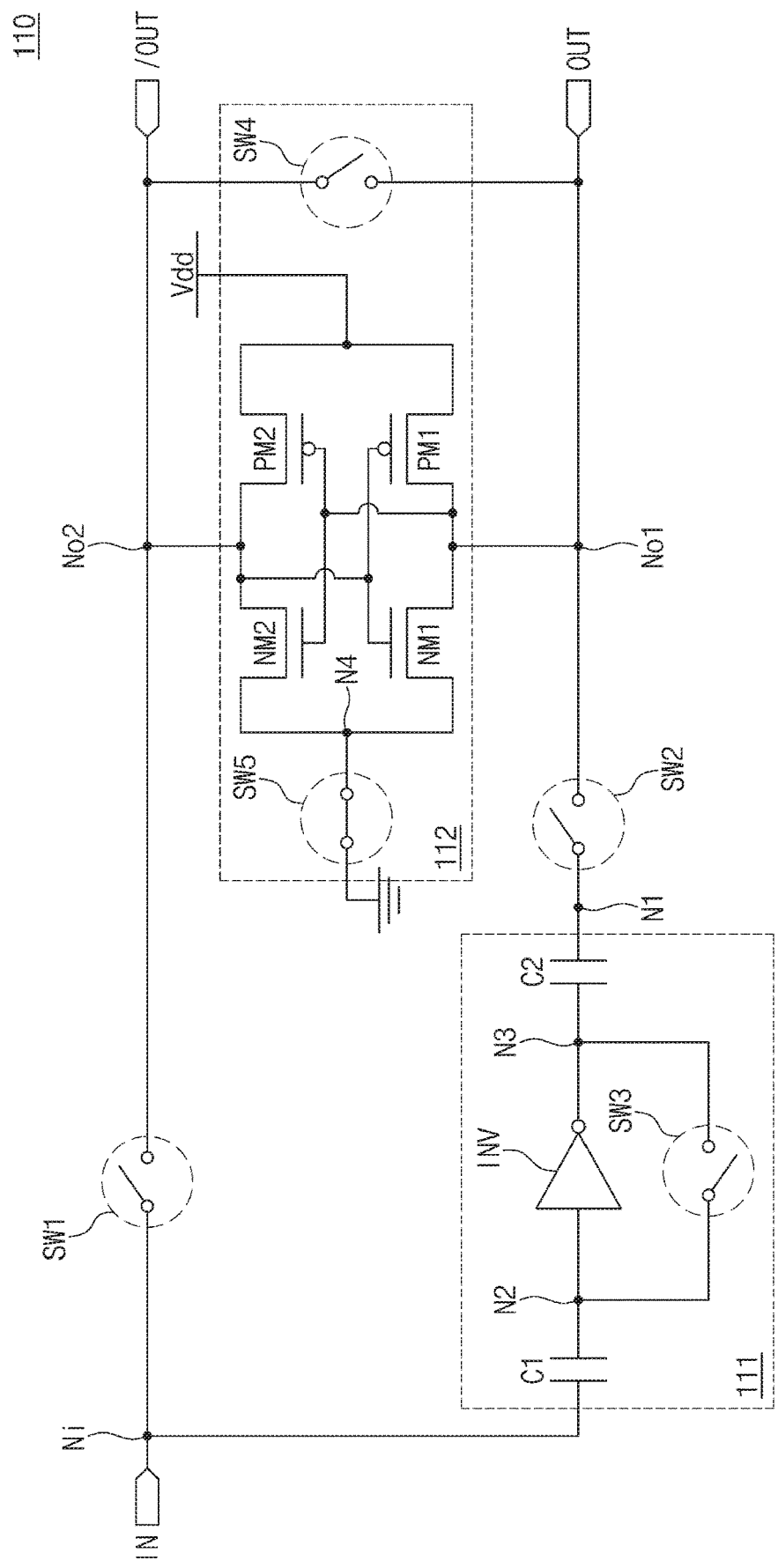
FIG. 10C is a circuit diagram describing an operation in an amplifying period according to an embodiment of the present disclosure.

FIG. 10C is a circuit diagram describing an operation in an amplifying period according to an embodiment of the present disclosure. Referring to FIGS. 8 and 10C, the fifth switch SW5 may be turned on, and the first to fourth switches SW1, SW2, SW3, and SW4 may be turned off.

A latch circuit may perform an amplification operation when the fifth switch SW5 is turned on during the amplifying period AMP. The amplifier 112 may generate the output signal OUT and the inverted output signal /OUT based on a voltage difference of the first output node No1 and the second output node No2 at the third time point T3. In an embodiment, the voltage of the first output node No1 at the third time point T3 may correspond to a sum of the first voltage and the amplification voltage, and the voltage of the second output node No2 may be the second voltage.

In an embodiment, when an absolute value of the differential voltage Vdf is greater than or equal to the reference voltage Vrf, the amplifier 112 may generate the output signal OUT corresponding to a first logic level. For example, the first logic level may be the logical low level. In an embodiment, when the absolute value of the differential voltage Vdf is smaller than the reference voltage Vrf, the amplifier 112 may generate the output signal OUT corresponding to a second logic level. For example, the second logic level may be the logical high level.

Because the amplifier 112 performs the amplification operation based on the amplification voltage that the pre-amplifier 111 generates by amplifying a sum of the reference voltage and the differential voltage with a voltage gain, as the voltage gain becomes greater, the influence of the offset of the amplifier 112 may be relatively small.

Figure 11A:
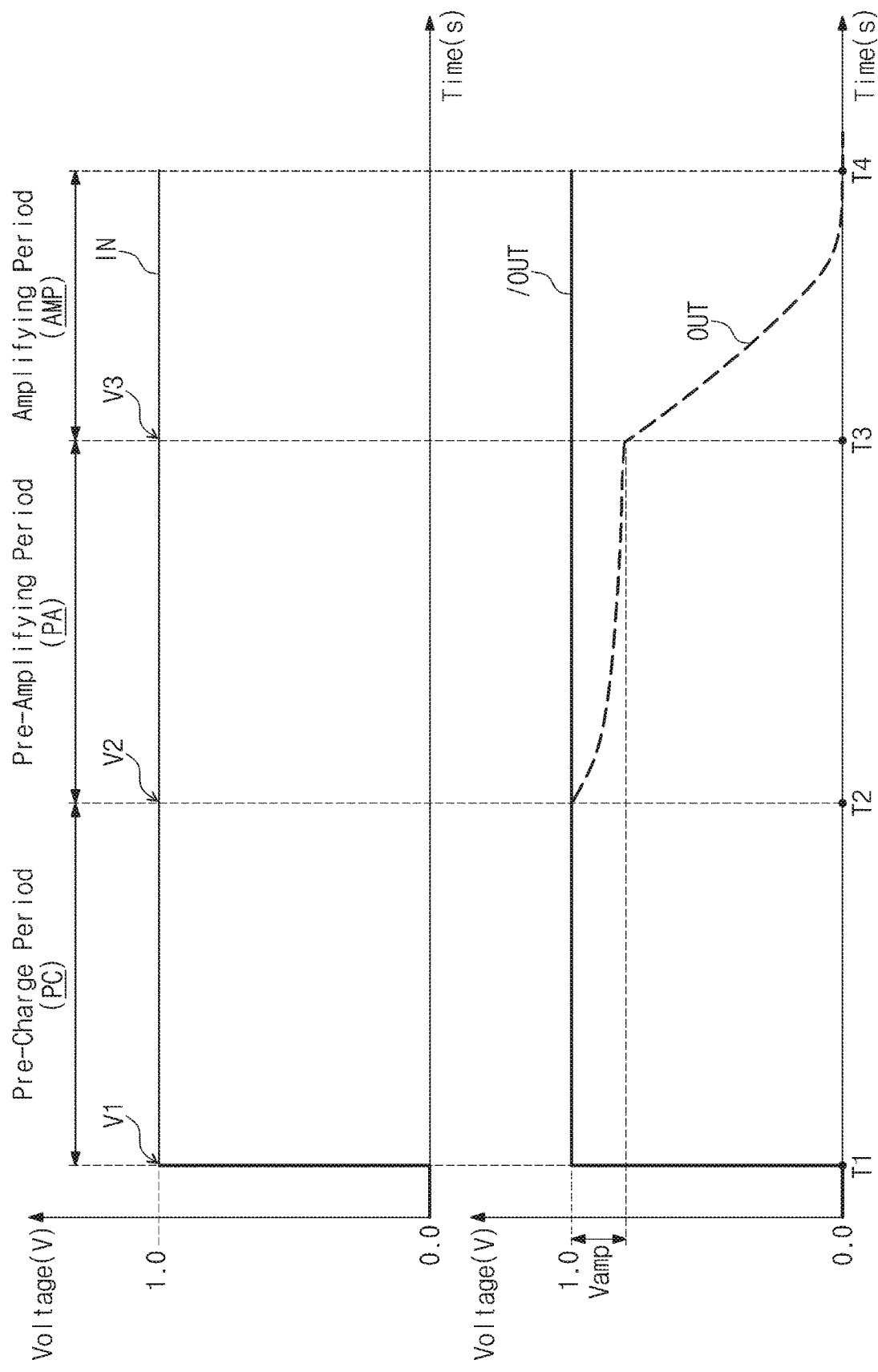
FIG. 11A is a graph illustrating a voltage waveform of an output signal according to an embodiment of the present disclosure.

FIG. 11A is a graph illustrating a voltage waveform of an output signal according to an embodiment of the present disclosure. Voltage waveforms of the input signal IN, the output signal OUT, and the inverted output signal /OUT illustrated in FIG. 11A will be described with reference to FIGS. 6 and 7. In FIG. 11A, a horizontal axis represents a time, and a vertical axis represents a voltage.

Referring to FIG. 11A, an operation of a sense amplifier will be described under the condition that data corresponding to the logic low level is stored in a memory cell connected to the sense amplifier.

The input signal IN may have the first voltage V1 during the pre-charge period PC, may have the second voltage V2 during the pre-amplifying period PA, and may have a third voltage during the amplifying period AMP. In an embodiment, when the data of the memory cell connected to the sense amplifier 110 represents logic low, the first, second and third voltages may be the same. When the first and second voltages of the input signal IN are the same, the absolute value of the differential voltage may be smaller than the reference voltage. As a consequence, the sense amplifier 110 may output the output signal OUT corresponding to the logic low.

During the pre-charge period PC, the first output node No1 may receive the input signal IN, and thus the voltage at the first output node No1 may be V1. the second output node No2 may also receive the input signal IN, whereby the voltage at the second output node No2 may be V1.

During the pre-amplifying period PA, the second output node No2 may receive the input signal IN. The second output node No2 may have the second voltage level. As the first voltage level and the second voltage level are the same, the voltage level of the second output node No2 may not change.

During the pre-amplifying period PA, the first output node No1 may receive an amplification signal having the amplification voltage Vamp. As such, the voltage at the first output node No1 may correspond to a sum of the first voltage V1 and the amplification voltage Vamp. The voltage at the first output node No1 may decrease depending on an amplification gain of the inverter INV.

In the amplifying period AMP, the amplifier 112 may amplify a voltage difference of the first output node No1 and the second output node No2 at the third time point T3. In an embodiment, the amplifier 112 may sense and amplify a difference between the sum of the first voltage V1 and the amplification voltage Vamp and the second voltage V2. The amplifier 112 may generate the output signal OUT having the logic low level and the inverted output signal /OUT having the logic high level.

FIG. 11B is a graph illustrating a voltage waveform of an output signal according to an embodiment of the present disclosure. Voltage waveforms of the input signal IN, the output signal OUT, and the inverted output signal /OUT of the sense amplifier 110 illustrated in FIG. 11B will be described with reference to FIGS. 6 and 7. In FIG. 11B, a horizontal axis represents a time, and a vertical axis represents a voltage.

Referring to FIG. 11B, an operation of a sense amplifier will be described under the condition that data corresponding to the logic high level are stored in a memory cell connected to the sense amplifier.

The input signal IN may have the first voltage V1 during the pre-charge period PC, may have the second voltage V2 during the pre-amplifying period PA, and may have a third voltage level during the amplifying period AMP. In an embodiment, when data of a memory cell connected to the sense amplifier 110 represents logic high, the second voltage V2 may be smaller than the first voltage V1 by more than Vrf, and may also be smaller than the third voltage V3. The second voltage V2 may correspond to a sum of the first voltage V1 and the differential voltage Vdf. In an embodiment, the sense amplifier 110 may output the output signal OUT having the logic high level when an absolute value of the differential voltage Vdf is greater than the reference voltage Vrf.

During the pre-charge period PC, the first output node No1 may receive the input signal IN. As such, the first output node No1 may have the first voltage level. Also, the second output node No2 may receive the input signal IN. As such, the second output node No2 may have the first voltage level.

During the pre-amplifying period PA, the second output node No2 may receive the input signal IN. The voltage level of the second output node No2 may be the second voltage level. That is, the voltage level of the second output node No2 may correspond to a sum of the first voltage level and the differential voltage level Vdf. As such, the voltage level of the second output node No2 may decrease.

Due to a propagation delay of signals in a circuit, the pre-amplifier may amplify the reference voltage level prior to the differential voltage level Vdf and may output an amplification result to the first output node No1. As such, during a period P1 between the second time point T2 and a time point Ta in the pre-amplifying period PA, the voltage level of the first output node No1 may decrease. Afterwards, during a period P2 between the time point Ta and the third time point T3 in the pre-amplifying period PA, the pre-amplifier may amplify a sum of the differential voltage level Vdf and the reference voltage level so as to be output to the first output node No1. As such, the voltage level of the first output node No1 may increase. At the third time point T3, the voltage level of the first output node No1 may correspond to a sum of the first voltage level and the amplification voltage level.

In the amplifying period AMP, the amplifier 112 may amplify a voltage level difference of the first output node No1 and the second output node No2 at the third time point T3. As such, the amplifier 112 may generate the output signal OUT having the logic high level and the inverted output signal /OUT having the logic low level. In an embodiment, the amplifier 112 may sense and amplify a difference between the sum of the first voltage level and the amplification voltage level Vamp and the second voltage level. The amplifier 112 may generate the output signal OUT having the logic high level and the inverted output signal /OUT having the logic low level.

Figure 12:
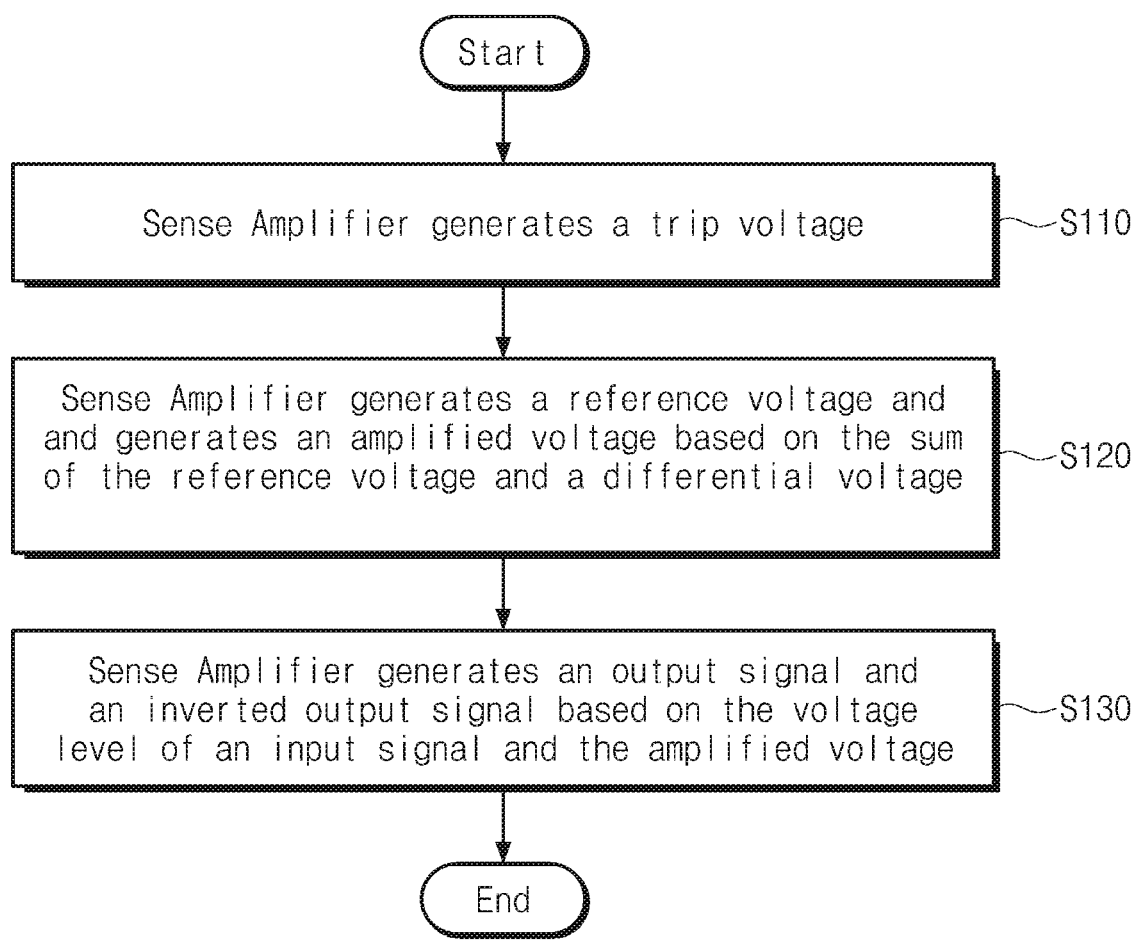
FIG. 12 is a flowchart illustrating an operation of a sense amplifier according to an embodiment of the present disclosure in detail.

FIG. 12 is a flowchart illustrating an operation of a sense amplifier according to an embodiment of the present disclosure. An operating method of the sense amplifier 110 of FIG. 5 is illustrated in FIG. 12.

In operation S110, the sense amplifier 110 may generate a trip voltage. The first output node No1 and the second output node No2 of the sense amplifier 110 may have the first voltage V1 of the input signal IN.

In operation S120, the sense amplifier 110 may generate a reference voltage and an amplification voltage. The reference voltage may be generated based on the charge injection of the third switch SW3. The reference voltage may be a voltage for identifying a logic level of data stored in a memory cell connected to the sense amplifier 110.

The sense amplifier 110 may amplify a sum of the reference voltage and the differential voltage to generate an amplification voltage Vamp. In an embodiment, the sense amplifier 110 may amplify the sum of the reference voltage and the differential voltage with a maximum voltage gain, due to the trip voltage generated in operation S110. The first output node No1 of the sense amplifier 110 may have a sum of the first voltage V1 of the input signal IN and the amplification voltage Vamp, and the second output node No2 of the sense amplifier 110 may have the second voltage V2 of the input signal IN.

In operation S130, the sense amplifier 110 may generate the output signal OUT and the inverted output signal /OUT based on the voltage level of the input signal IN and the amplification voltage. The sense amplifier 110 may amplify a difference between the sum of the first voltage V1 at the first output node No1 and the amplification voltage level and the second voltage level of the input signal IN at the second output node No2 and may generate the output signal OUT and the inverted output signal /OUT. As the sense amplifier 110 generates the output signal OUT and the inverted output signal /OUT based on the amplification voltage level, the sense amplifier 110 may operate at a high speed and with low power.

According to an embodiment of the present disclosure, as a sense amplifier amplifies a differential voltage level, the sense amplifier reduces power consumption and improves a sensing speed.

According to an embodiment of the present disclosure, a sense amplifier including a pre-amplifier and a memory device including the sense amplifier are provided.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:
1. A sense amplifier comprising:
  a pre-amplifier electrically connected between an input node receiving an input signal and a first node receiving a signal from the pre-amplifier;
  a second switch arranged to receive the signal from the first node and electrically connected between the first node and a first output node outputting an output signal;
  an amplifier electrically connected between the first output node and a second output node outputting an inverted output signal; and
  a first switch electrically connected between the input node and the second output node,
  wherein the pre-amplifier includes:
  an inverter electrically connected between the input node and the first node; and
  a third switch electrically connected between the input node and the first node.

2. The sense amplifier of claim 1, wherein an input terminal of the inverter is connected to the input node through a first capacitor, an output terminal of the inverter is connected to the first node through a second capacitor, a first end of the third switch is connected to the input node through the first capacitor, and a second end of the third switch is connected to the first node through the second capacitor,
  wherein the amplifier includes:
  a latch circuit connected between the first output node and the second output node; and
  a fourth switch connected between the first output node and the second output node,
  wherein the latch circuit includes:
  a first PMOS transistor connected between a power node receiving a power supply voltage and the first output node, and configured to operate based on the inverted output signal;
  a first NMOS transistor connected between the first output node and a fourth node, and configured to operate based on the inverted output signal;
  a second PMOS transistor connected between the power node and the second output node outputting the inverted output signal, and configured to operate based on the output signal;
  a second NMOS transistor connected between the second output node and the fourth node, and configured to operate based on the output signal; and
  a fifth switch connected between the fourth node and a ground node.

3. The sense amplifier of claim 2, wherein, during a pre-charge period, the first to fourth switches are controlled to be turned on, the fifth switch is controlled to be turned off, and each of the first capacitor and the second capacitor is charged with a trip voltage.

4. The sense amplifier of claim 3, wherein, during a pre-amplifying period following the pre-charge period, the first and second switches are controlled to be turned on, the third to fifth switches are controlled to be turned off, a voltage of the input terminal of the inverter corresponds to a sum of the trip voltage, a reference voltage, and a differential voltage, the inverter generates an amplification signal having an amplification voltage based on a sum of the reference voltage and the differential voltage, and a voltage of the output terminal of the inverter corresponds to a sum of the trip voltage and the amplification voltage.

5. The sense amplifier of claim 4, wherein the differential voltage corresponds to a voltage obtained by subtracting a first voltage of the input signal in the pre-charge period from a second voltage of the input signal in the pre-amplifying period, and
  wherein the reference voltage is a voltage corresponding to an amount of charges accumulated in the first capacitor when the third switch is turned off.

6. The sense amplifier of claim 4, wherein the third switch is implemented with a PMOS transistor, and
  wherein the reference voltage is proportional to a width of a gate terminal of the PMOS transistor.

7. The sense amplifier of claim 4, wherein the third switch is implemented with a PMOS transistor, and
  wherein the reference voltage is proportional to a voltage of a gate of the PMOS transistor.

8. The sense amplifier of claim 4, wherein the pre-amplifier further includes:
  a sixth switch connected between the second node and the third node; and
  a seventh switch connected between the second node and the third node,
  wherein, during the pre-charge period, at least one of the third, sixth, and seventh switches is configured to be turned on, wherein, during the pre-amplifying period, the third, sixth, and seventh switches are configured to be turned off, and wherein the reference voltage is proportional to the number of switches turned on during the pre-charge period from among the third, sixth, and seventh switches.

9. The sense amplifier of claim 4, wherein, when an absolute value of the differential voltage is greater than or equal to the reference voltage, the output signal corresponding to a first logic level is generated.

10. The sense amplifier of claim 4, wherein, when an absolute value of the differential voltage is smaller than the reference voltage, the output signal corresponding to a second logic is generated.

11. The sense amplifier of claim 4, wherein, during an amplifying period following the pre-amplifying period, the first to fourth switches are configured to be turned off, the fifth switch is configured to be turned on, and the amplifier generates the output signal and the inverted output signal based on the input signal and the amplification signal.

12. The sense amplifier of claim 11, wherein the pre-amplifier further includes an eighth switch configured to control the inverter, and wherein the eighth switch is configured to be turned on during the pre-charge period and the pre-amplifying period and is configured to be turned off during the amplifying period.

13. A sense amplifier comprising:
a pre-amplifier electrically connected between an input node receiving an input signal and a first node receiving a signal from the pre-amplifier;
a second switch arranged to receive the signal from the first node and electrically connected between the first node and a first output node outputting an output signal;
an amplifier electrically connected between the first output node and a second output node outputting an inverted output signal; and
a first switch electrically connected between the input node and the second output node,
wherein,
during a pre-charge period, the first switch and the second switch are controlled to be turned on, and the pre-amplifier generates a trip voltage,
during a pre-amplifying period following the pre-charge period, the first switch and the second switch are controlled to be turned on, and the pre-amplifier generates a reference voltage and generates an amplification voltage based on a sum of the reference voltage and a differential voltage, and
during an amplifying period following the pre-amplifying period, the first switch and the second switch are controlled to be turned off, and the amplifier generates the output signal and the inverted output signal based on a voltage of the input signal and the amplification voltage.

14. The sense amplifier of claim 13, wherein the pre-amplifier further includes:
a first capacitor connected between the input node and a second node;
an inverter connected between the second node and a third node;
a third switch connected between the second node and the third node; and
a second capacitor connected between the third node and the first node.

15. The sense amplifier of claim 14, wherein, during the pre-charge period, the third switch is configured to be turned on, a voltage of the second node is the trip voltage, and a voltage of the third node is the trip voltage, wherein, during the pre-amplifying period, the third switch is configured to be turned off, a voltage of the second node corresponds to a sum of the trip voltage, the reference voltage, and the differential voltage, the inverter generates the amplification voltage based on a sum of the reference voltage and the differential voltage, and the voltage of the third node corresponds to a sum of the trip voltage and the amplification voltage.

16. The sense amplifier of claim 14, wherein the differential voltage corresponds to a voltage obtained by subtracting a first voltage of the input signal in the pre-charge period from a second voltage of the input signal in the pre-amplifying period, and wherein the reference voltage is a voltage corresponding to an amount of charges accumulated in the first capacitor when the third switch is turned off.

17. The sense amplifier of claim 13, wherein the amplifier includes:
a latch circuit connected between the first output node and the second output node; and
a fourth switch connected between the first output node and the second output node, and configured to be turned on during the pre-charge period and to be turned off during the pre-amplifying period and the amplifying period,
wherein the latch circuit further includes:
a first PMOS transistor connected between a power node receiving a power supply voltage and the first output node, and configured to operate based on the inverted output signal;
a first NMOS transistor connected between the first output node and a fourth node, and configured to operate based on the inverted output signal;
a second PMOS transistor connected between the power node and the second output node outputting the inverted output signal, and configured to operate based on the output signal;
a second NMOS transistor connected between the second output node and the fourth node, and configured to operate based on the output signal; and
a fifth switch connected between the fourth node and a ground node, and configured to be turned off during the pre-charge period and the pre-amplifying period and to be turned on during the amplifying period.

18. A memory device comprising:
a memory cell array including a plurality of memory cells connected to a plurality of bit lines;
a global input/output line connected to the plurality of bit lines; and
a sense amplifier configured to receive an input signal through the global input/output line and to output an output signal and an inverted output signal,
wherein the sense amplifier includes:
a pre-amplifier electrically connected between an input node receiving the input signal and a first node;
a second switch electrically connected between the first node and a first output node outputting the output signal;
an amplifier electrically connected between the first output node and a second output node outputting the inverted output signal; and
a first switch electrically connected between the input node and the second output node,
wherein the pre-amplifier includes:

a first capacitor electrically connected between the first node and a second node;

an inverter electrically connected between the second node and a third node;

a third switch electrically connected between the second node and the third node; and a second capacitor electrically connected between the third node and the first node.

19. The memory device of claim 18, wherein, during a pre-charge period, the first to third switches are controlled to be turned on, a voltage of the second node is a trip voltage, and a voltage of the third node is the trip voltage.

20. The memory device of claim 19, wherein, during a pre-amplifying period following the pre-charge period, the first and second switches are configured to be turned on, the third switch is controlled to be turned off, the voltage of the second node corresponds to a sum of the trip voltage, a reference voltage, and a differential voltage, the inverter generates an amplification signal having an amplification voltage based on a sum of the reference voltage and the differential voltage, and the voltage of the third node corresponds to a sum of the trip voltage and the amplification voltage.

\* \* \* \* \*